United States Patent [19]
Honma

[11] Patent Number: 6,108,235
[45] Date of Patent: Aug. 22, 2000

[54] MEMORY DEVICE

[75] Inventor: Yoshikazu Honma, Kawasaki, Japan

[73] Assignee: Fujitsu Limited, Kawasaki, Japan

[21] Appl. No.: 09/217,197

[22] Filed: Dec. 22, 1998

[30] Foreign Application Priority Data

Apr. 22, 1998 [JP] Japan ................................. 10-112029

[51] Int. Cl.$^7$ ................................................ G11C 16/04
[52] U.S. Cl. ............................. 365/185.04; 365/230.03; 365/185.11; 711/163
[58] Field of Search .................... 365/185.04, 185.11, 365/185.29, 230.03; 711/163

[56] References Cited

U.S. PATENT DOCUMENTS

| | | | |
|---|---|---|---|
| 4,648,076 | 3/1987 | Schrenk | 365/189.01 |
| 4,665,506 | 5/1987 | Cline et al. | 365/189.01 |
| 4,744,062 | 5/1988 | Nakamura et al. | 365/185.04 |
| 5,084,843 | 1/1992 | Mitsuishi et al. | 365/218 |
| 5,226,006 | 7/1993 | Wang et al. | 365/189.01 |
| 5,646,890 | 7/1997 | Lee et al. | 365/185.11 |
| 5,687,121 | 11/1997 | Lee et al. | 365/185.11 |
| 5,917,750 | 6/1999 | Miyakawa et al. | 365/185.04 |
| 5,930,826 | 7/1999 | Lee et al. | 711/163 |

FOREIGN PATENT DOCUMENTS

5-173887  7/1993  Japan .

*Primary Examiner*—David Nelms
*Assistant Examiner*—Gene N. Auduong
*Attorney, Agent, or Firm*—Armstrong, Westerman, Hattori, McLeland & Naughton

[57] ABSTRACT

A memory device for performing the writing and erasing of data in an individual block, including a protection designation storage unit for storing, for each memory block, protection designation data for inhibiting the writing and erasing of data; and a specific block designation storage unit for storing, for each memory block, specific block designation data for inhibiting the release of protection. When a memory block continues to be designated as a specific block according to specific block designation data, even though a protection-released state for disregarding protection designation data has been set in accordance with a protection release signal, the protection release signal is disregarded. As a result, even in the protection released state, the writing and the erasing of data is inhibited relative to the memory block which has been designated a specific block, and double data protection levels can be provided. When the writing or the erasing of data is to be performed in a memory block designated as a specific block, simply setting the protection release signal in the protection-released state is not enough, and a more complicated operation, i.e., altering the protection designation data, is required whereby the security provided for protected data is increased.

16 Claims, 10 Drawing Sheets

FIRST EMBODIMENT

FIG.2

PROTECTION RELEASE FUNCTION OF FIRST EMBODIMENT

| CASE | PROTECTION RELEASE SIGNAL 20 | SPECIFIC BLOCK DESIGNATION SIGNAL 18 | PROTECTION DESIGNATION SIGNAL 14 | PROTECTION SIGNAL PRT |
|---|---|---|---|---|
| 1 | L: UNRELEASED | X | L: UNPROTECTED | L: UNPROTECTED (WRITE/ERASE ARE PERMITTED) |
| 2 | L: UNRELEASED | X | H: PROTECTED | H: PROTECTED (WRITE/ERASE ARE INHIBITED) |
| 3 | H: RELEASED | L: NON-SPECIFIC BLOCK | L: UNPROTECTED | L: UNPROTECTED (WRITE/ERASE ARE PERMITTED) |
| 4 | H: RELEASED | L: NON-SPECIFIC BLOCK | H: PROTECTED | L: UNPROTECTED (WRITE/ERASE ARE PERMITTED) |
| 5 | H: RELEASED | H: SPECIFIC BLOCK | L: UNPROTECTED | L: UNPROTECTED (WRITE/ERASE ARE PERMITTED) |
| 6 | H: RELEASED | H: SPECIFIC BLOCK | H: PROTECTED | H: PROTECTED (WRITE/ERASE ARE INHIBITED) |

MODIFICATION OF PROTECTION RELEASE FUNCTION
ACCORDING TO THE FIRST EMBODIMENT

| CASE | PROTECTION RELEASE SIGNAL 20 | SPECIFIC BLOCK DESIGNATION SIGNAL 18 | PROTECTION DESIGNATION SIGNAL 14 | PROTECTION SIGNAL PRT |
|---|---|---|---|---|
| 1 | L: UNRELEASED | x | L: UNPROTECTED | L: UNPROTECTED (WRITE/ERASE ARE PERMITTED) |
| 2 | L: UNRELEASED | x | H: PROTECTED | H: PROTECTED (WRITE/ERASE ARE INHIBITED) |
| 3 | H: RELEASED | L: NON-SPECIFIC BLOCK | L: UNPROTECTED | L: UNPROTECTED (WRITE/ERASE ARE PERMITTED) |
| 4 | H: RELEASED | L: NON-SPECIFIC BLOCK | H: PROTECTED | H: PROTECTED (WRITE/ERASE ARE INHIBITED) |
| 5 | H: RELEASED | H: SPECIFIC BLOCK | L: UNPROTECTED | L: UNPROTECTED (WRITE/ERASE ARE PERMITTED) |
| 6 | H: RELEASED | H: SPECIFIC BLOCK | H: PROTECTED | H: PROTECTED (WRITE/ERASE ARE INHIBITED) |

PROTECTION RELEASE FUNCTION OF SECOND EMBODIMENT

| CASE | FIRST PROTECTION RELEASE SIGNAL 20 | SECOND PROTECTION RELEASE SIGNAL 60 | PROTECTION RELEASE FUNCTION |
|---|---|---|---|
| 1 | L: UNRELEASED | L: UNPROTECTED | PROTECT ACCORDING TO PROTECTION DESIGNATION SIGNAL 14 |
| 2 | H: RELEASED | L: UNRELEASED | RELEASE PROTECTION FOR BLOCKS OTHER THAN SPECIFIC BLOCK |
| 3 | H: RELEASED | H: PROTECTED | RELEASE PROTECTION FOR ALL BLOCKS |
| 4 | L: UNRELEASED | H: PROTECTED | RELEASE PROTECTION FOR ALL BLOCKS |

FIG.10

CONVENTIONAL DATA PROTECTION RELEASE FUNCTION

| CASE | PROTECTION RELEASE SIGNAL 20 | PROTECTION DESTINATION SIGNAL | PROTECTION SIGNAL |
|---|---|---|---|
| 1 | L: UNRELEASED | L: UNPROTECTED | L: UNPROTECTED (WRITE/ERASE ARE PERMITTED) |
| 2 | L: UNRELEASED | H: PROTECTED | H: PROTECT (WRITE/ERASE ARE INHIBITED) |
| 3 | H: RELEASED | L: UNPROTECTED | L: UNPROTECTED (WRITE/ERASE ARE PERMITTED) |
| 4 | H: RELEASED | H: PROTECTED | L: UNPROTECTED (WRITE/ERASE ARE PERMITTED) |

MEMORY DEVICE

BACKGROUND OF THE INVENTION

1. Field of the Invention

The present invention relates to a memory device for writing data to and erasing data from an each individual block, and in particular, to a memory device having a stored data protection function for inhibiting the writing and the erasing of data in an each block and a protection release function for releasing the writing and erasing inhibition.

2. Related Arts

Well known as a memory device for writing data to and erasing data from an each individual block is a flash memory which uses a nonvolatile memory cell. A stored data protection function for inhibiting the writing and the erasing of data is provided for the flash memory in order to prevent the writing and the erasing of data due to an erroneous operation. For example, regarding a memory block corresponding to a boot area, in which is stored an initial program-loading program which is to be read upon the activation of a computer, it is so set in advance that it inhibits the writing and the erasing of data, whereby during a normal operation other data are not written to the memory block, or data stored therein are not erased erroneously. It should be noted that since in the initial state, or in another specific situation, the writing or the erasing of data may be required for a memory block, a function for releasing the data protection function is also provided for the flash memory.

Figure 10:
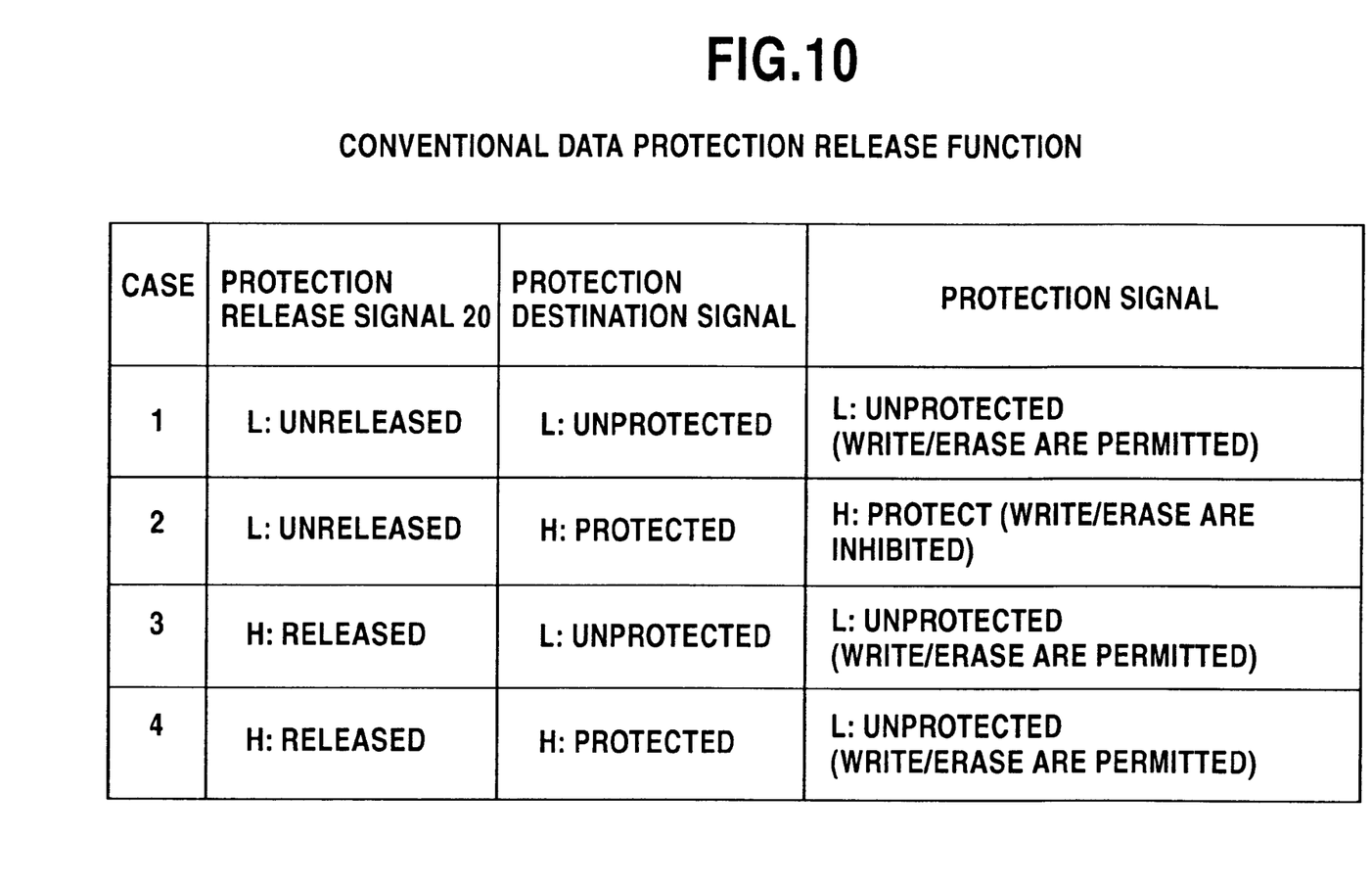
FIG. 10 is a table for explaining a conventional data protection release function.

FIG. 10 is a table for explaining a conventional data protection release function. A conventional memory device comprises a protection designation storage unit for storing protection designation data used to inhibit the writing and the erasing of data in individual blocks, and a protection release signal for releasing the protection. In the normal state, the protection release signal is in the unreleased state in order to validate the protection designation data. As is shown in cases 1 and 2 in FIG. 10, in accordance with a protection designation signal read from the protection designation storage unit, a protection signal for inhibiting the writing and the erasing of data in a writing/erasing circuit is adjusted to the unprotected state or to the protected state. On the other hand, as is shown in cases 3 and 4 in FIG. 10, in the protection released state, the protection signal is set to the unprotected state, regardless of the state of the protection designation signal read from the protection designation storage unit, and the writing and the erasing of data is permitted.

When the above memory device is to write or to erase data relative to a memory block for which protection is designated, protection designation data are simply disregarded by a protection release signal. Therefore, data in the protection designation storage unit need not be changed, so that as a result the memory device can flexibly cope with various writing/erasing processes, such as a process for writing/erasing data in a specific memory block, and the overall alteration of data.

However, according to the conventional memory device, when the protection released state is set by a protection release signal, the writing or the erasing of data may be erroneously performed for a memory block containing data which should not be changed. That is, since only a simple function is employed for the memory device, i.e., a temporary protection release function for disregarding protection designation data in accordance with a protection release signal, data in a memory block having a high protection priority could easily be changed by the temporary protection release function. Therefore, data for which high security should be provided, such as a boot program in a boot memory area, may be erroneously changed or erased, which is not a preferable situation.

SUMMARY OF THE INVENTION

It is, therefore, one objective of the present invention to provide a memory device which can maintain a writing/erasing inhibited state (a protected state) even during a protection-released state.

It is another objective of the present invention to provide a memory device wherein, even during a protection-released state, a writing/erasing inhibited state (a protected state) can not be released unless an additional operation is performed.

It is an additional objective of the present invention to provide a memory device for which a plurality of protection levels can be furnished.

To achieve the above objectives, according to the present invention, a memory device, for performing the writing and the erasing of data in an individual block, comprises a protection designation storage unit for storing, for each memory block, protection designation data for inhibiting the writing and erasing of data; and a specific block designation storage unit for storing, for each memory block, specific block designation data for inhibiting the release of protection. When a memory block continues to be designated as a specific block according to specific block designation data, even though a protection-released state for disregarding protection designation data has been set in accordance with a protection release signal, the protection release signal is disregarded. As a result, even in the protection released state, the writing and the erasing of data is inhibited relative to the memory block which has been designated a specific block, and double data protection levels can be provided. When the writing or the erasing of data is to be performed in a memory block designated as a specific block, simply setting the protection release signal in the protection-released state is not enough, and a more complicated operation, i.e. altering the protection designation data, is required whereby the security provided for protected data is increased.

To achieve the above objectives, according to the present invention, a memory device, in which a plurality of memory blocks are provided and which performs a writing and an erasing of data by units of the memory blocks, comprises:

a writing/erasing circuit for writing data to or erasing data from a selected memory block in response to a write/erase signal;

a protection designation storage unit for storing, for each of the memory blocks, protection designation data for inhibiting the writing and the erasing of data; and a specific block designation storage unit for storing, for each of the memory blocks, specific block designation data for inhibiting a release of protection, wherein, when the release of protection is not effected, a writing/erasing operation by the writing/erasing circuit is inhibited in accordance with the protection designation data which corresponds to the selected memory block; when the release of the protection is effected and the specific block designation data corresponding to the selected memory block are in a non-designating state, the writing/erasing operation is permitted; and when the release of protection is effected but the specific block designation data corresponding to the selected memory block are in a designating state, the writing/erasing operation is inhibited in accordance with the protection designation data.

According to the present invention, a protection level for the data stored in the memory block can be doubled, and the alteration of data due to an erroneous writing/erasing operation can be prevented.

Furthermore, to achieve the above objectives, according to the present invention, a memory device, in which a plurality of memory blocks are provided and which performs a writing and an erasing of data by units of the memory blocks, comprises:

a writing/erasing circuit for writing data to or erasing data from a selected memory block in response to a write/erase signal;

a protection designation storage unit for storing, for each of the memory blocks, protection designation data for inhibiting the writing and the erasing of data; and a specific block designation storage unit for storing, for each of the memory blocks, specific block designation data for inhibiting a first release of protection, wherein, in a case where a second release of protection is not effected, when the first release of protection is not effected, a writing/erasing operation performed by the writing/erasing circuit is inhibited in accordance with the protection designation data corresponding to the selected memory block; when the first release of protection is effected and the specific block designation data corresponding to the selected memory block are in a non-designating state, the writing/erasing operation is permitted; and when the first release of protection is effected but the specific block designation data corresponding to the selected memory block are in a designating state, the writing/erasing operation is inhibited in accordance with the protection designation data, and wherein, in a case where the second release of protection is effected, the writing/erasing operation is permitted regardless of the status of the specific block designation data.

According to the present invention, in addition to the protection of data afforded by the use of the protection designation storage unit, also provided are first and second protection released states. In the first protection released state, protection is released in accordance with a specific block designation storage unit, and in the second protection released state, protection for all memory blocks is released, so that the level of protection is increased into plural levels.

DETAILED DESCRIPTION OF THE PREFERRED EMBODIMENTS

The preferred embodiments of the present invention will now be described while referring to the accompanying drawings. It should be noted, however, that the technical scope of the present invention is not limited to these embodiments.

Figure 1:
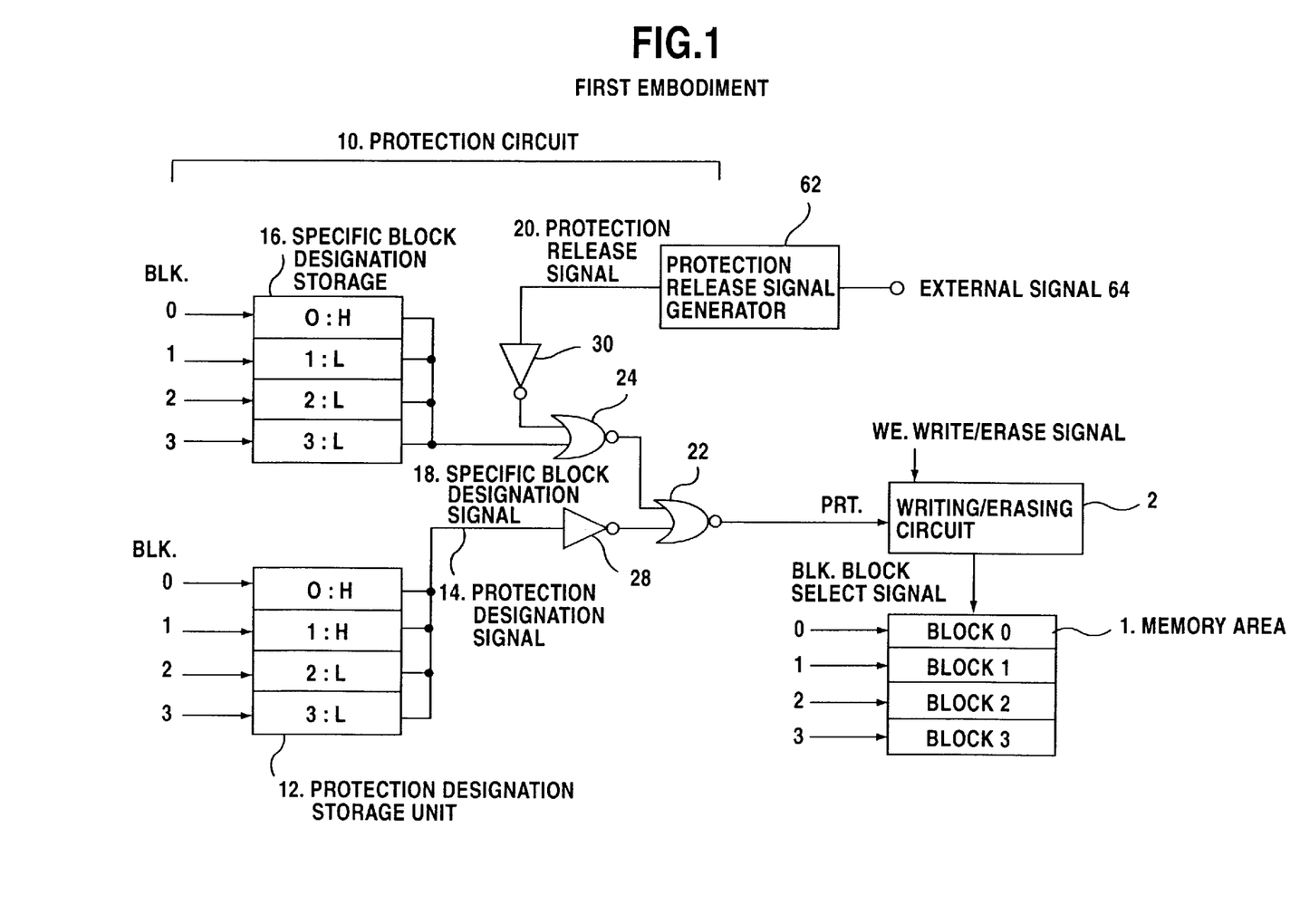
FIG. 1 is a diagram illustrating a protection circuit arrangement of according to a first embodiment of the present invention.

FIG. 1 is a diagram illustrating a protection circuit arrangement according to a first embodiment of the present invention. In FIG. 1, a memory area 1 consists of four memory blocks, 0 to 3. One of the memory blocks 0 to 3 is selected in accordance with a block select signal BLK, and writing (of a program), erasing and reading processes are performed for the selected memory block. A plurality of memory cells, which are nonvolatile memory cells, as will be described later, are provided for each of the memory blocks which constitute the memory area 1. The general structure of a nonvolatile memory cell includes a control gate connected to a word line, a drain electrode connected to a bit line, a source electrode connected to a source line, and a floating gate used for the storage of data. To write data (a program) into the nonvolatile memory cell, for example, it is set to a condition wherein the word line voltage is 9 V, the bit line voltage is 5 V and the source voltage is 0 V, so that electrons are introduced into the floating gate. To erase data from the memory cell, it is set to a condition where the word line voltage is −9 V, the bit line voltage is floating and the source line voltage is 5 V, so that the electrons are removed from the floating gate. As is described above, the voltages of the word line, the bit line and the source line must be adjusted to optimal levels in order for data in the memory cell to be written or erased. A writing/erasing circuit 2 provides these control. The writing/erasing circuit 2 receives a write/erase signal WE, and exercises control of the voltages of the word line, the bit line, and the source line in accordance with the writing state or the erasing state.

In order to protect data stored in the memory area 1, a protection circuit 10 transits a protection signal PRT to the writing/erasing circuit 2. When, for example, the protection circuit 10 transmits an H-level protection signal PRT to the writing/erasing circuit 2, the writing and erasing of data in the memory area 1 is inhibited, regardless of the status of the write/erase signal WE.

For the writing and the erasing of data in individual blocks in the flash memory for which the nonvolatile memory cells are employed, the blocks in the memory area 1 are selected in accordance with a block select signal BLK. Therefore, in order to inhibit the writing and the erasing of data for each memory block, provided in the protection circuit 10 is a protection designation storage unit 12 for storing, for each memory block, protection designation data for inhibiting the writing and the erasing of data. The protection designation storage unit 12 receives a block select signal BLK and outputs corresponding protection designation data as a protection designation signal 14.

A protection release signal 20 is generated in accordance with an external signal 64 which is received, and is set, for example, at level H in the protection released state. When the protection release signal 20 is in the unreleased state (level L), normally a protection signal PRT is generated in accordance with protection designation data stored in the protection designation storage unit 12. Therefore, when the protection designation data (level H) are stored in an area, in the protection designation storage unit 12, which corresponds to the memory block in which stored data are to be protected, the erroneous writing and erasing of data in a normal state can be prevented. When the protection release signal 20 is set to the protection released state (level H), on the other hand, the protection designation data in the protection designation storage unit 12 are disregarded, the protection signal PRT is set to the unprotected state (level L), so that the writing and the erasing of data in the memory block is permitted.

The protection circuit 10 includes not only the protection designation storage unit 12 but also a specific block designation storage unit 16 for storing, for each memory block, specific block designation data for inhibiting the release of protection. In the specific block designation storage unit 16, specific block designation data for inhibiting the release of protection are stored in correspondence with a memory block in order to increase the protection level for data in the memory block. That is, when the specific block designation data (18) is in the designation state (level H), even though the protection circuit 10 is set, in response to a protection release signal 20, for the protection released state in which protection designation data (14) in the protection designation storage unit 12 are disregarded, a target memory block is designated as a specific block and the protection release signal 20 is invalidated.

As a result, even in the protection released state according to the signal 20, the writing and the erasing of data in the memory block which is designated as a specific block is inhibited, so that the data protection level can therefore be doubled. To write or erase data in a memory block designated as a specific block, simply setting the protection release signal 20 in the protection-released state is not enough, but a more complicated operation, i.e., the altering of specific block designation data in the specific block designation storage unit 16 or the altering of protection designation data in the protection designation storage unit 12, is required, whereby the security level for data protection can be increased.

To implement the above described protection function, NOR gates 22 and 24, and inverters 28 and 30 are provided for the protection circuit 10. The protection designation signal 14, the specific block designation signal 18, and the protection release signal 20 are decoded by the NOR gates 22 and 24 and the inverters 28 and 30, and a protection signal PRT is generated.

Figure 2:
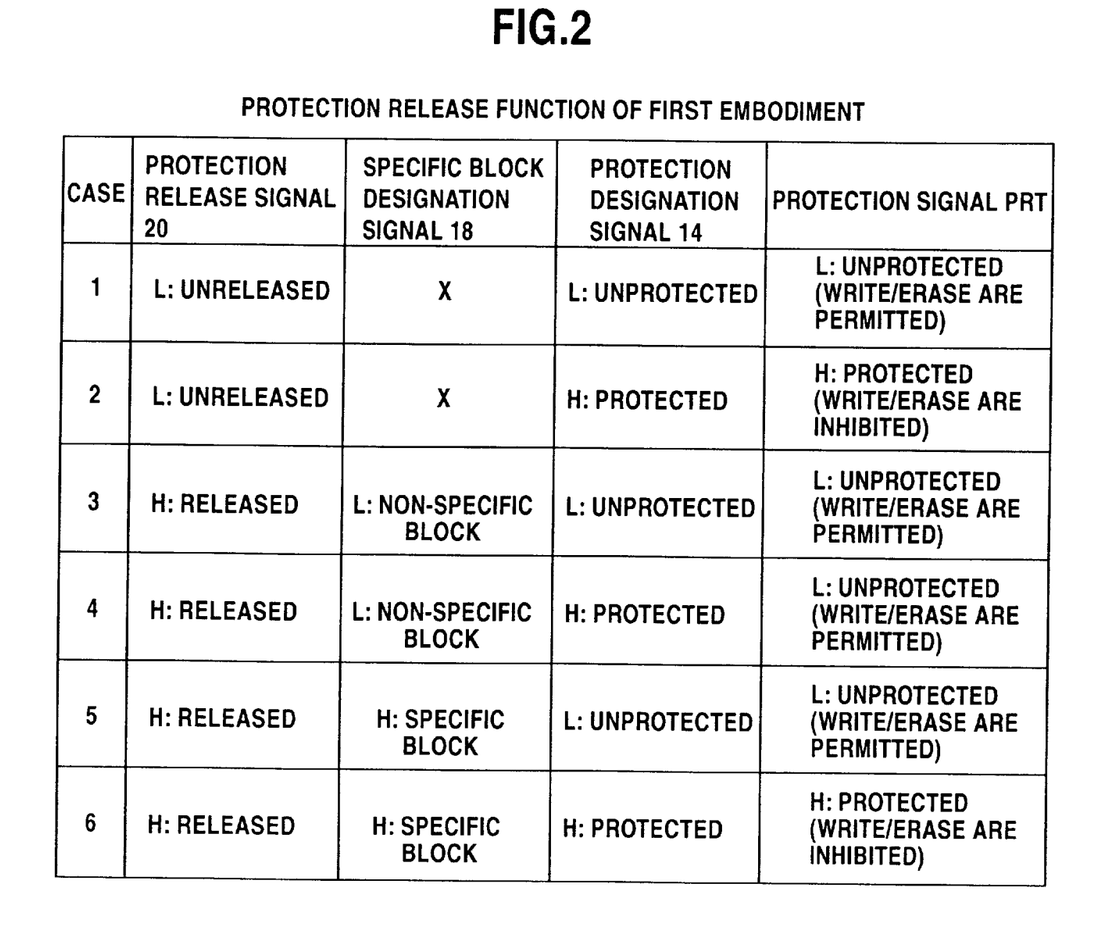
FIG. 2 is a table showing a protection release function according to the first embodiment.

FIG. 2 is a table showing the protection release function according to the first embodiment of the present invention. As is shown in FIG. 1, assume that the data in the protected state (level H) are stored in areas 0 and 1 of the protection designation storage unit 12, that data in the unprotected state (level L) are stored in areas 2 and 3, that data (level H) designated as a specific block are stored in area 0 of the specific block designation storage unit 16, and that data (level L) not designated as a specific block are stored in areas 1, 2 and 3. The protection release function in this situation will now be explained while referring to the table in FIG. 2.

Cases 1 and 2 show the protection release signal 20 in the unreleased signal state (level L). In this normal state, when a protection designation signal 14, which is output by the protection designation storage unit 12 in response to the block select signal BLK, is in the unprotected state (level L), the protection signal PRT becomes a unprotected signal (level L), so that the writing and the erasing of data is permitted. When the protection designation signal 14 is in the protected state (level H), the protection signal PRT also becomes the protected state (level H), and the writing and the erasing of data is inhibited. Therefore, in the above cases, when the memory block 0 or 1 is selected, the writing and the erasing of data is inhibited, while when memory block 2 or 3 is selected, the writing and the erasing of data is permitted.

When the protection signal 20 is in the released state (level H), as is shown in cases 3 and 4 in FIG. 2, the protected state or the unprotected state of the protection signal PRT is determined in accordance with the specific block designation data (18) stored in the specific block designation storage unit 16. If a memory block 1 is selected, the specific block designation signal 18 read from the specific block designation storage unit 16 is in the non-specific block state (level L), and accordingly, the protection signal PRT goes into the unprotected state (level L), regardless of the state of the protection designation signal 14, and as a result, the writing and erasing of data is permitted. In other words, in accordance with the protection release signal 20, the protection designation signal 14 output from the protection designation storage unit 12 is disregarded.

In addition, as is shown in cases 5 and 6 in FIG. 2, when the protection release signal 20 is in the released state (level H), and the specific block select signal 18 is in the specific block designation state (level H), the function for disregarding the protection designation signal 14 in accordance with the protection release signal 20 is inhibited, and the state of the protection signal PRT is determined in accordance with the protection designation signal 14 read from the protection designation storage unit 12. Therefore, if the protection designation signal 14 is in the unprotected state (level L), accordingly, the protection signal PRT goes to the unprotected state (level L), so that the writing and the erasing of data is permitted. When the protection designation signal 14 is in the protected state (level H), accordingly, the protection signal PRT goes to the protected state (level H), so that the writing and the erasing of data is inhibited.

Figure 3:
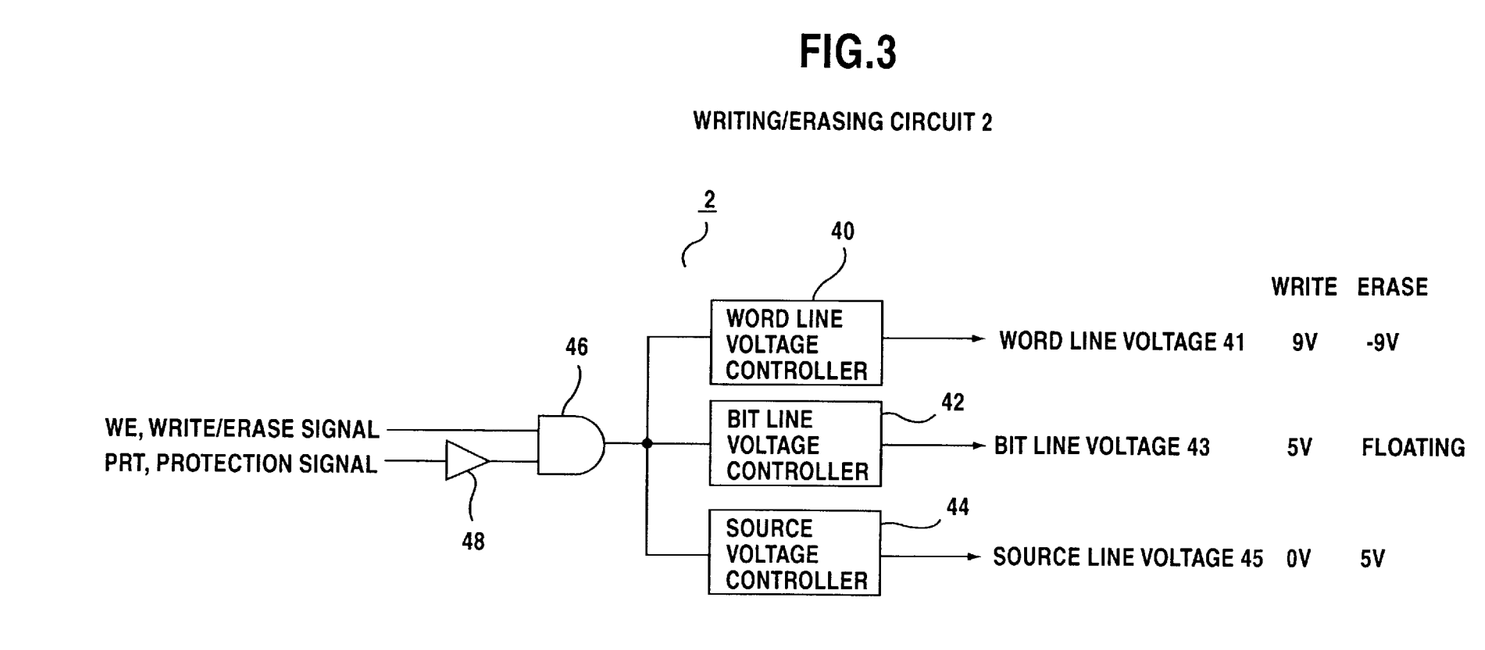
FIG. 3 is a diagram illustrating a writing/erasing circuit arrangement.

FIG. 3 is a diagram illustrating the arrangement of the writing/erasing circuit 2. As was explained while referring to FIG. 1, a write/erase signal WE and a protection signal PRT are supplied to the writing/erasing circuit 2. The protection signal PRT is transmitted through an inverter 48 to an AND gate 46 to validate or invalidate the write/erase signal WE. The write/erase signal WE is, for example, a 2-bit signal, and data writing or data erasing is instructed by setting either bit to level H. When the protection signal PRT is in the protected state (level H), the output of the AND gate 46 is forcibly reduced to level L to inhibit the control of a word line voltage controller 40, a bit line voltage controller 42, and a source line voltage controller 44 in the writing/erasing circuit 2. As a result, the writing and erasing of data is inhibited.

When the protection signal PRT is in the unprotected state (level L), the write/erase signal WE is directly transmitted to the word line voltage controller 40, the bit line voltage controller 42, and the source line voltage controller 44. A word line voltage 41, a bit line voltage 43 and a source line voltage 45, which are the outputs of the individual voltage controllers, are set to the levels or states shown in FIG. 3 for writing and for erasing. Therefore, the writing and the erasing of data is permitted. As was previously described, for the writing of data, the word line voltage 41 is 9 V, the bit line voltage 43 is 5 V and the source line voltage 45 is 0 V, and electrons are introduced into the floating gate. And for the erasing of data, the word line voltage 41 is −9 V, the bit line voltage 43 is floating and the source line voltage 45 is 5 V, and electrons in the floating gate are removed.

Figure 4:
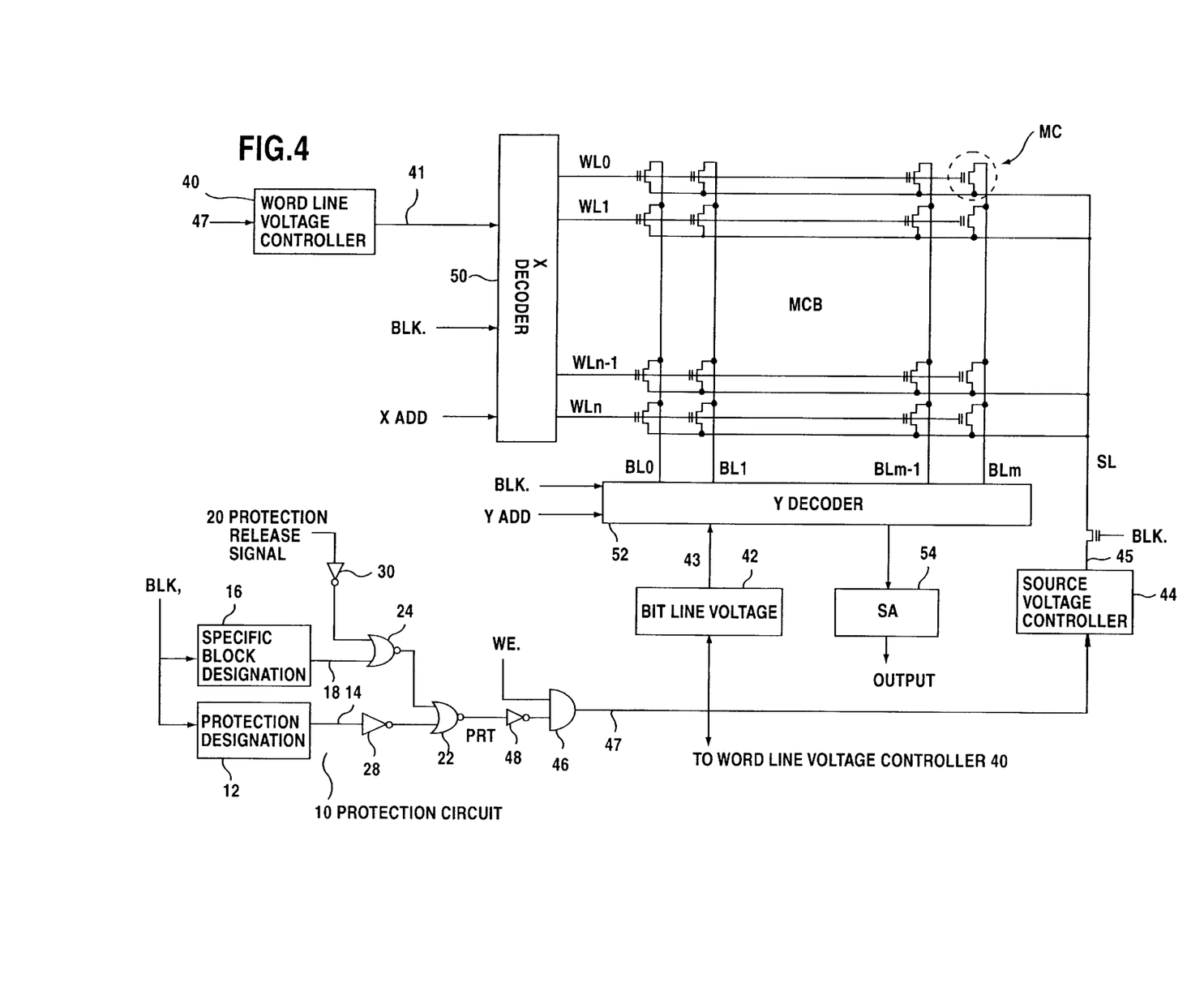
FIG. 4 is a diagram illustrating a memory block arrangement in a flash memory for which nonvolatile memory cells are employed.

FIG. 4 is a diagram illustrating the arrangement of one memory block in a flash memory using nonvolatile memory cells. In FIG. 4, a plurality of word lines WL and a plurality of bit lines BL are provided in a memory cell block MCB, and nonvolatile memory cells MC are located at individual intersections thereof. The drain electrodes of the memory cells MC are connected to the bit lines BL, the control gates are connected to the word lines WL, and the source electrodes are connected in common to a source line SL. An X decoder 50 receives an X address XAdd and a block select signal BLK, and in the block selection state, selects one word line WL in accordance with the X address. The selected word line WL is adjusted to the word line voltage 41 which is generated by the word line voltage controller 40. A Y decoder 52 receives a Y address YAdd and a block select signal BLK, and in the block selection state, selects one bit line BL in accordance with the Y address.

During the reading operation, the selected bit line BL is connected to a sense amplifier 54, and data stored in the memory cell are output. During the writing/erasing operation, the word lines are set to the word line voltage 41 generated by the word line voltage controller 40, and the bit lines BL are set to the bit line voltage 43 generated by the bit line voltage generator 42. Similarly, the voltage of the source line SL is controlled by the source line voltage controller 44.

The protection circuit 10 is shown in FIG. 4. As is described above, the writing and the erasing of data for the memory block is permitted or inhibited in accordance with the protection signal PRT generated by the protection circuit 10. The arrangement of the protection circuit 10 is the same as that in FIG. 1.

Figure 5:
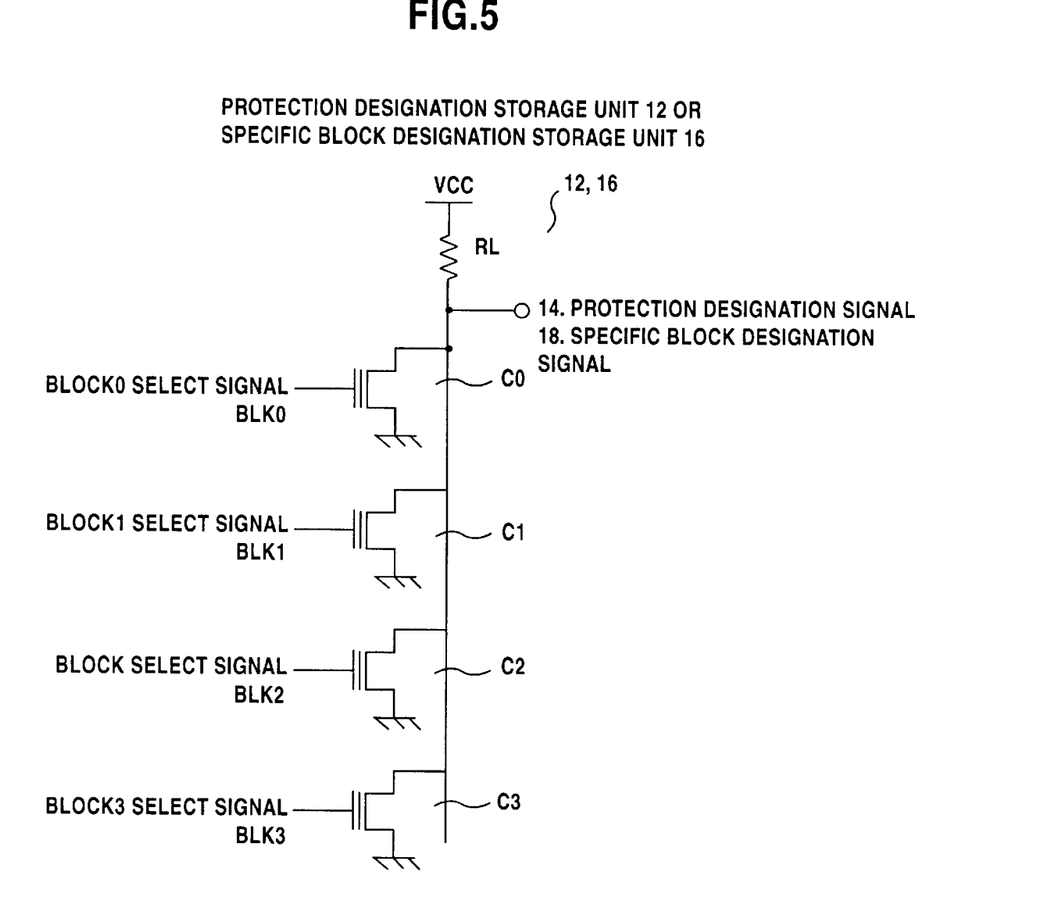
FIG. 5 is a diagram illustrating a specific structure for a protection designation storage unit or for a specific block designation storage unit.

FIG. 5 is a diagram illustrating a specific arrangement for the protection designation storage unit 12 or the specific block designation storage unit 16. In the storage unit, four memory cells C0 to C3 are connected in parallel to a power source VCC across a load resistor RL. The same type of nonvolatile memory is used for the memory cells C0 to C3. Block select signals BLK0 to BLK3 are supplied to the gates of the memory cells C0 to C3, and a protection designation signal 14, or a specific block designation signal 18, is output to a junction of the load resistor RL and the memory cell. These memory cells are normally in the erase state, and when the memory cells are not protected or are not specified, they are rendered conductive in response to a block select signal BLK at level H while an output signal goes to level L. Further, the memory cell can be protected or specified by writing data thereto, and in response to the block select signal BLK at level H, the output protection designation signal 14 or the specific block designation signal 18 stays at level H.

Figure 6:
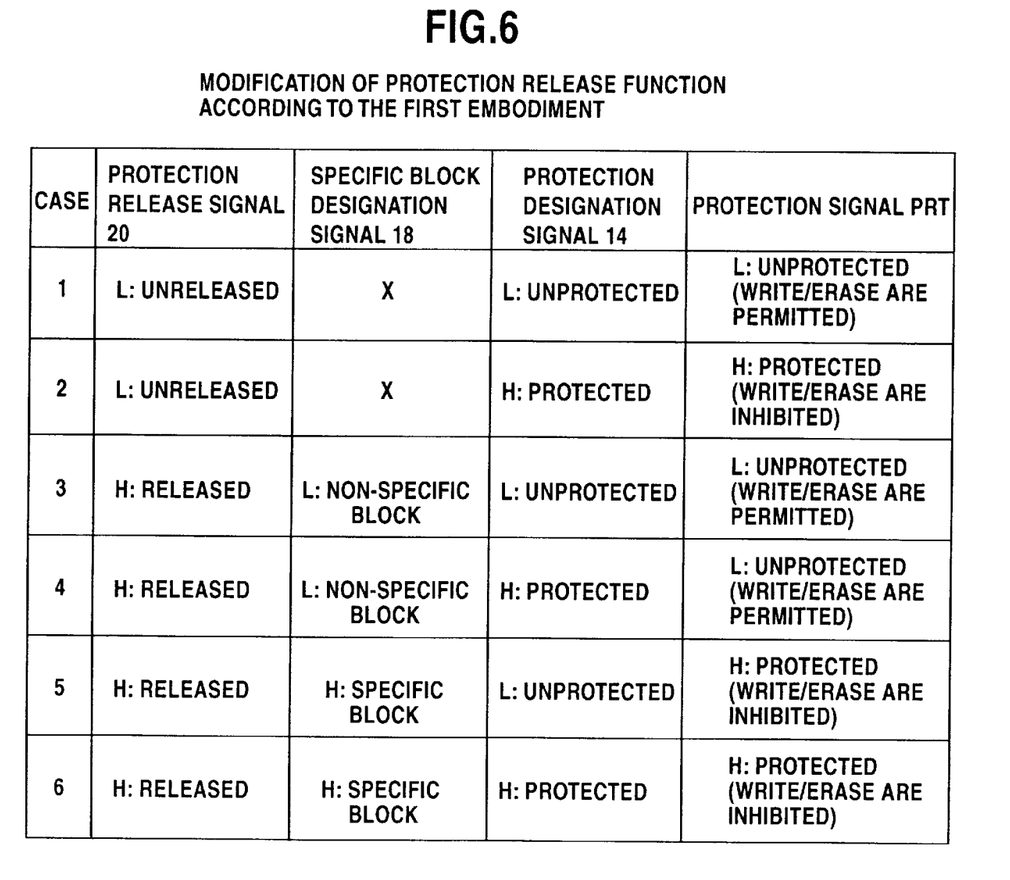
FIG. 6 is a table showing a modification of the protection release function according to the first embodiment.

FIG. 6 is a table showing a modification of the protection release function according to the first embodiment. Just how the modification in FIG. 6 is different becomes apparent when it is compared with the table in FIG. 2. That is, in the normal state for cases 1 and 2, the same protection unreleased function as in FIG. 2 is provided. In cases 3 and 4, as well as in FIG. 2, the protection signal PRT goes into the unprotected state in accordance with the released state (level H) of the protection release signal 20, regardless of the state of the protection designation signal 14, and the writing and erasing of data is permitted. In the modification in FIG. 6, cases 5 and 6 differ from those in FIG. 2. In these cases, when the protection release signal 20 is in the released state (level H) and the specific block designation signal 18 is in the specific block designation state (level H), the protection signal PRT goes to the protected state (level H) regardless of the state of the protection designation signal 14 output from the protection designation storage unit 12, and the writing and erasing of data is inhibited.

As is described above, in the modification in FIG. 6, even though the protection release signal 20 is in the released state (level H), when the specific block designation signal 18 is in the specific block designation state (level H), the writing and erasing of data is forcibly inhibited. As a result, matching of the data stored in the specific block designation storage unit 16 and the data stored in the protection designation storage unit 12 need not be required, and the data (18) stored in the storage unit 16 are always employed as first priority.

Figure 7:
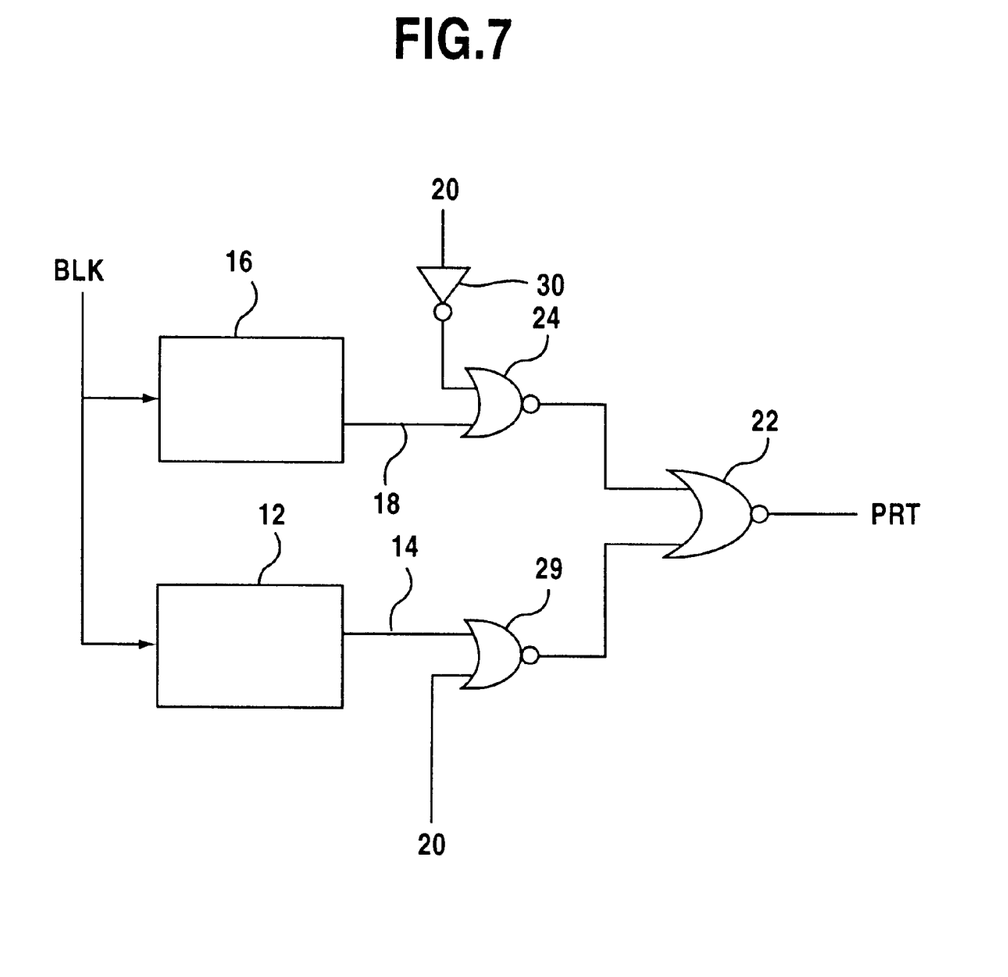
FIG. 7 is a diagram showing a protection circuit for implementing the modification.

FIG. 7 is a diagram illustrating a protection circuit 10 for the implementation of the above modification. Since in cases 1 and 2 in FIG. 6 the protection release signal 20 is at level L for protection is unreleased state, a NOR gate 29 inverts the protection designation signal 14 provided by the protection designation storage unit 12 and passes the inverted signal. Since the output of an inverter 30 is at level H, the output of a NOR gate 24 is forcibly reduced to level L, and output of the NOR gate 29 is inverted and passed through a NOR gate 22. As a result, the protection signal PRT is at the level which corresponds to that of the protection designation signal 14.

In cases 3 to 6 in FIG. 6, the protection release signal 20 goes to level H for release, and the output of the NOR gate 29 falls to level L, regardless of the level of the protection designation signal 14. The output of the inverter 30 is reduced to level L, and the specific block designation signal 18 is inverted and the inverted signal is passed through the NOR gate 24. Further, the output of the NOR gate 24 is inverted and passed through the NOR gate 22, and the protection signal PRT is set to the level corresponding to that of the specific block designation signal 18.

Figure 8:
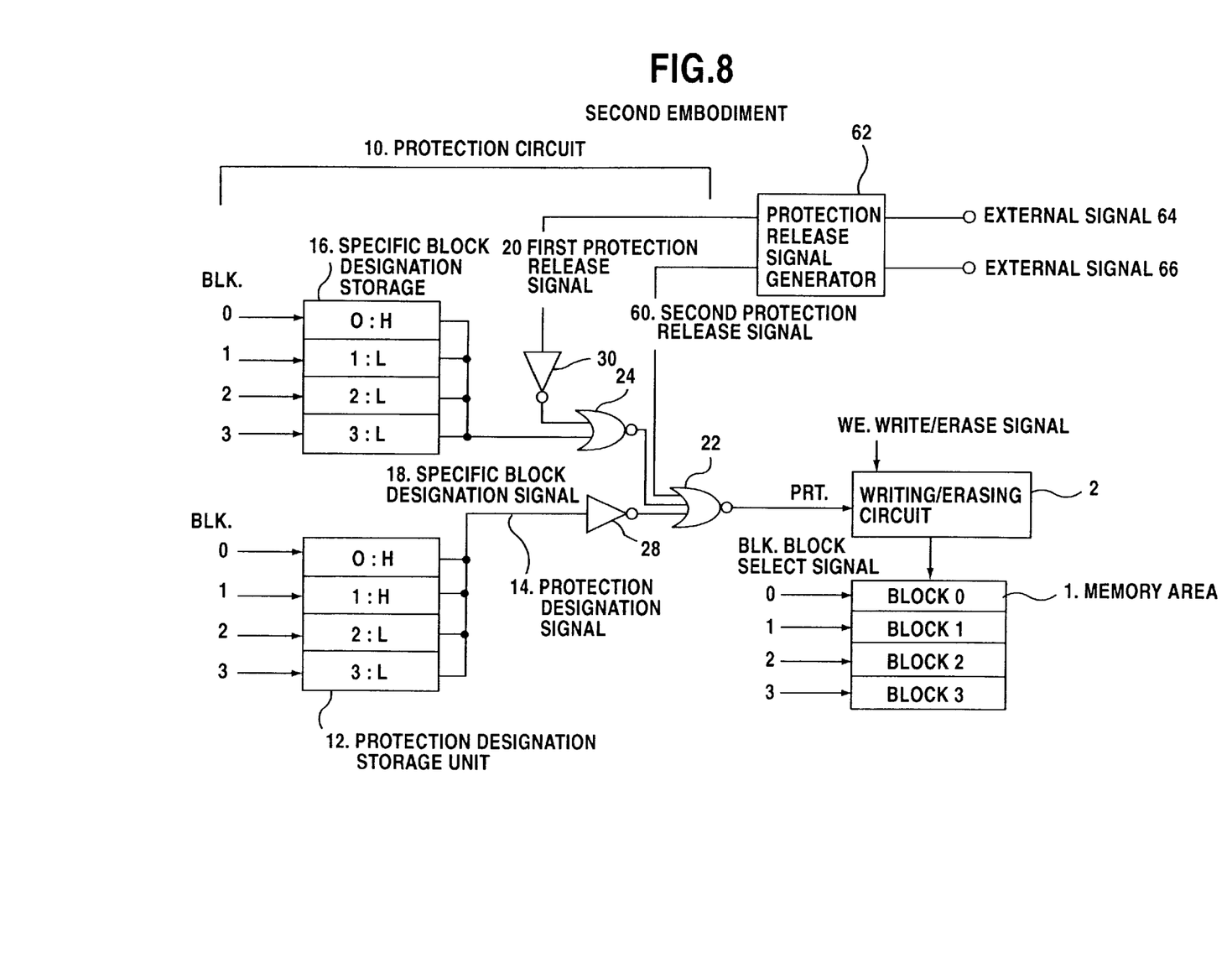
FIG. 8 is a diagram illustrating a protection circuit arrangement according to a second embodiment of the present invention.

FIG. 8 is a diagram illustrating the arrangement of a protection circuit according to a second embodiment of the present invention. While two protection levels for data in the memory block are provided in the first embodiment, three protection levels are employed in the second embodiment in FIG. 8. That is, in the second embodiment, in addition to a first protection release signal 20, a second protection release signal 60 is employed. The second protection release signal 60 is supplied to a NOR gate 22.

Figure 9:
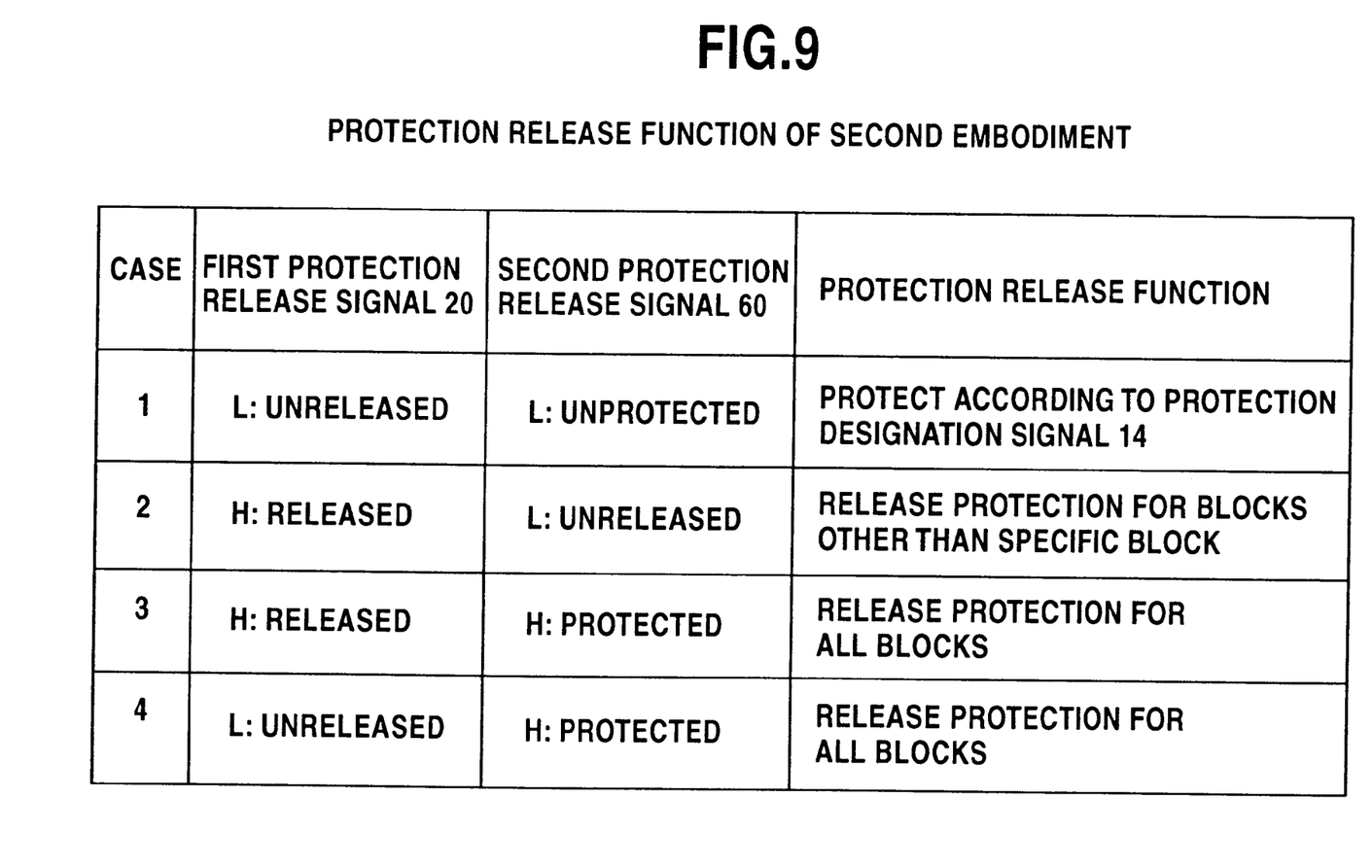
FIG. 9 is a table showing a protection release function according to the second embodiment.

FIG. 9 is a table showing the protection release function according to the second embodiment. The protection release function for the second embodiment will now be explained while referring to the table in FIG. 9.

In the second embodiment, the protection circuit 10 has a protection release function for permitting, in response to the first protection release signal 20, the writing and the erasing of data in memory blocks other than a specific block, and a protection release function for permitting, in response to the second protection release signal 60, the writing and the erasing of data in all of the memory blocks, including a specific block. In case 1 in FIG. 9, the first and the second protection release signals 20 and 60 are in the unreleased state (level L). In this normal state, the protection release function is determined in accordance with the protection destination signal 14 output by the protection destination storage unit 12. In other words, case 1 in FIG. 9 is the same as cases 1 and 2 in FIG. 2 or FIG. 6.

In case 2 in FIG. 9, the first protection release signal 20 is in the released state (level H) and the second protection release signal 60 is in the unreleased state (level L). In case 2, the writing and the erasing of data in memory blocks other than a specific block is permitted. As for a specific block, either the protection is released or the protection is forcibly set in accordance with the protection designation signal 14. In other words, this corresponds to cases 3 to 6 in FIG. 2 or in the modification in FIG. 6.

In cases 3 and 4 in FIG. 9, the second protection release signal 60 is in the released state (level H). In these cases, regardless of the first protection release signal 20 and of the state of the protection designation signal 14 which is output from the protection designation storage unit 12, the protection of data in all of the memory blocks is released, and the protection signal PRT is forcibly set to the unprotected state (level L). As a result, the writing and the erasing of data in all of the memory blocks is permitted.

As is described above, according to the second embodiment, when the first and the second protection release signals 20, 60 are in the unreleased state, the state of the protection signal PRT is determined in accordance with the protection designation signal 14, which is output from the protection designation storage unit 12. In addition, when the first protection release signal 20 is set to the released state (level L), the state of the protection signal PRT is determined in accordance with the specific block designation signal 18 output by the specific block designation storage unit 16, and the data in a specified memory block are protected. When the second protection release signal 60 is set to the released state (level H), the protection signal PRT is set to the unprotected state (level L), even if a block is specified, and the writing and the erasing of data in all of the memory blocks is permitted.

In the first and the second embodiments, the protection release signals 10 and 60 are generated by using a received external signal. As is shown in FIGS. 1 and 8, a protection release signal generator 62 for receiving an external signal 64 or 66 is provided. Upon application of a high voltage to the external signal 64 or 66, the protection release signal generator 62 controls the setting in the released state (level H) of the protection release signals 20 and 60.

As is described above, according to the present invention, in the normal state, either the writing and the erasing of data, or the inhibition of the writing and the erasing of data can be selected for each memory block. Even in the protection released state, inhibition of the writing and the erasing of data (the protected state) can be maintained for a specific block, so that there is less possibility that data in a specified memory block will be erroneously changed or erased. In addition, a plurality of hierarchy for protection release state can be acquired by using a protection release signals, and a protection level for data in a memory block can be plural levels.

What is claimed is:

1. A memory device, in which a plurality of memory blocks are provided and which performs a writing and an erasing of data by units of said memory blocks, comprising:
   a writing/erasing circuit for writing data to or erasing data from a selected memory block in response to a write/erase signal;
   a protection designation storage unit for storing, for each of said memory blocks, protection designation data for inhibiting the writing and the erasing of data; and
   a specific block designation storage unit for storing, for each of said memory blocks, specific block designation data for inhibiting a release of protection,
   wherein, when the release of protection is not effected, a writing/erasing operation by said writing/erasing circuit is inhibited in accordance with said protection designation data which corresponds to said selected memory block; when the release of said protection is effected and said specific block designation data corresponding to said selected memory block are in a non-designating state, said writing/erasing operation is permitted; and when the release of protection is effected but said specific block designation data corresponding to said selected memory block are in a designating state, said writing/erasing operation is inhibited in accordance with said protection designation data.

2. A memory device according to claim 1, wherein a protection release signal for instructing said release of protection is generated in accordance with a signal which is supplied from outside.

3. A memory device according to claim 1, wherein said memory block includes a plurality of nonvolatile memory cells.

4. A memory device according to claim 3, wherein said writing/erasing circuit includes a word line voltage controller for controlling a word line voltage for said nonvolatile memory cells, a bit line voltage controller for controlling a bit line voltage for said nonvolatile memory cells, and a source line voltage controller for controlling a source line voltage for said nonvolatile memory cells.

5. A memory device, in which a plurality of memory blocks are provided and which performs a writing and an erasing of data by units of said memory blocks, comprising:
   a writing/erasing circuit for writing data to or erasing data from a selected memory block in response to a write/erase signal;
   a protection designation storage unit for storing, for each of said memory blocks, protection designation data for inhibiting the writing and the erasing of data; and
   a specific block designation storage unit for storing, for each of said memory blocks, specific block designation data for inhibiting a release of protection,
   wherein, when the release of protection is not effected, a writing/erasing operation by said writing/erasing circuit is inhibited in accordance with said protection designation data which corresponds to said selected memory block; when the release of said protection is effected and said specific block designation data corresponding to said selected memory block are in a non-designating state, said writing/erasing operation is permitted; and when the release of protection is effected but said specific block designation data corresponding to said selected memory block are in a designating state, said writing/erasing operation is inhibited.

6. A memory device according to claim 5, wherein a protection release signal for instructing said release of protection is generated in accordance with a signal which is supplied from outside.

7. A memory device according to claim 5, wherein said memory block includes a plurality of nonvolatile memory cells.

8. A memory device according to claim 7, wherein said writing/erasing circuit includes a word line voltage controller for controlling a word line voltage for said nonvolatile memory cells, a bit line voltage controller for controlling a bit line voltage for said nonvolatile memory cells, and a source line voltage controller for controlling a source line voltage for said nonvolatile memory cells.

9. A memory device, in which a plurality of memory blocks are provided and which performs a writing and an erasing of data by units of said memory blocks, comprising:

a writing/erasing circuit for writing data to or erasing data from a selected memory block in response to a write/erase signal;

a protection designation storage unit for storing, for each of said memory blocks, protection designation data for inhibiting the writing and the erasing of data; and a specific block designation storage unit for storing, for each of said memory blocks, specific block designation data for inhibiting a first release of protection, wherein, in a case where a second release of protection is not effected, when said first release of protection is not effected, a writing/erasing operation performed by said writing/erasing circuit is inhibited in accordance with said protection designation data corresponding to said selected memory block; when said first release of protection is effected and said specific block designation data corresponding to said selected memory block are in a non-designating state, said writing/erasing operation is permitted; and when said first release of protection is effected but said specific block designation data corresponding to said selected memory block are in a designating state, said writing/erasing operation is inhibited in accordance with said protection designation data, and wherein, in a case where said second release of protection is effected, said writing/erasing operation is permitted regardless of the status of said specific block designation data.

10. A memory device according to claim 9, wherein a first protection release signal for instructing said first release of protection and a second release of protection signal for instructing said second release of protection are generated in accordance with a signal which is supplied from outside.

11. A memory device according to claim 9, wherein said memory block includes a plurality of nonvolatile memory cells.

12. A memory device according to claim 11, wherein said writing/erasing circuit includes a word line voltage controller for controlling a word line voltage for said nonvolatile memory cells, a bit line voltage controller for controlling a bit line voltage for said nonvolatile memory cells, and a source line voltage controller for controlling a source line voltage for said nonvolatile memory cells.

13. A memory device, in which a plurality of memory blocks are provided and which performs a writing and an erasing of data by units of said memory blocks, comprising:

a writing/erasing circuit for writing data to or erasing data from a selected memory block in response to a write/erase signal;

a protection designation storage unit for storing, for each of said memory blocks, protection designation data for inhibiting the writing and the erasing of data; and a specific block designation storage unit for storing, for each of said memory blocks, specific block designation data for inhibiting a first release of protection, wherein, in a case where a second release of protection is not effected, when said first release of protection is not effected, a writing/erasing operation performed by said writing/erasing circuit is inhibited in accordance with said protection designation data corresponding to said selected memory block; when said first release of protection is effected and said specific block designation data corresponding to said selected memory block are in a non-designating state, said writing/erasing operation is permitted; and when said first release of protection is effected but said specific block designation data corresponding to said selected memory block are in a designating state, said writing/erasing operation is inhibited, and wherein, in a case where said second release of protection is effected, said writing/erasing operation is permitted regardless of the status of said specific block designation data.

14. A memory device according to claim 13, wherein a first protection release signal for instructing said first release of protection and a second protection release signal for instructing said second release of protection are generated in accordance with a signal which is supplied from outside.

15. A memory device according to claim 13, wherein said memory block includes a plurality of nonvolatile memory cells.

16. A memory device according to claim 15, wherein said writing/erasing circuit includes a word line voltage controller for controlling a word line voltage for said nonvolatile memory cells, a bit line voltage controller for controlling a bit line voltage for said nonvolatile memory cells, and a source line voltage controller for controlling a source line voltage for said nonvolatile memory cells.

* * * * *